US012334308B2

(12) United States Patent
Lim et al.

(10) Patent No.: US 12,334,308 B2
(45) Date of Patent: Jun. 17, 2025

(54) BATCH-TYPE APPARATUS FOR ATOMIC LAYER ETCHING (ALE), AND ALE METHOD AND SEMICONDUCTOR DEVICE MANUFACTURING METHOD BASED ON THE SAME APPARATUS

(71) Applicant: SAMSUNG ELECTRONICS CO., LTD., Suwon-si (KR)

(72) Inventors: Hanjin Lim, Seoul (KR); Younsoo Kim, Yongin-si (KR); Sunmin Moon, Yongin-si (KR); Jungmin Park, Seoul (KR); Hyungsuk Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 310 days.

(21) Appl. No.: 17/683,506

(22) Filed: Mar. 1, 2022

(65) Prior Publication Data
US 2023/0062485 A1 Mar. 2, 2023

(30) Foreign Application Priority Data
Aug. 24, 2021 (KR) .......................... 10-2021-0111874

(51) Int. Cl.
*H01J 37/32* (2006.01)
*H01L 21/67* (2006.01)

(52) U.S. Cl.
CPC .... *H01J 37/3244* (2013.01); *H01J 37/32357* (2013.01); *H01J 37/32522* (2013.01); (Continued)

(58) Field of Classification Search
CPC ............. H01J 37/3244; H01J 37/32357; H01J 37/32522; H01J 37/32715; (Continued)

(56) References Cited

U.S. PATENT DOCUMENTS 9,236,244 B2 1/2016 Chandrasekharan et al.
10,273,584 B2 4/2019 Blomberg et al.
(Continued)

FOREIGN PATENT DOCUMENTS

JP 2009295729 A * 12/2009
JP 2017028256 A * 2/2017 ............. C23C 16/24
(Continued)

OTHER PUBLICATIONS

Communication dated Apr. 8, 2025, issued by the Korean Patent Office in Korean Application No. 10-2021-0111874.

*Primary Examiner* — Aiden Lee
(74) *Attorney, Agent, or Firm* — Sughrue Mion, PLLC

(57) ABSTRACT

A batch-type apparatus for atomic layer etching (ALE), which is capable of ALE-processing several wafers at the same time, and an ALE method and a semiconductor device manufacturing method based on the batch-type apparatus, are provided. The batch-type apparatus for ALE includes a wafer stacking container in which a plurality of wafers are arranged in a vertical direction, an inner tube extending in the vertical direction, a plurality of nozzles arranged in a first outer portion in the inner tube in a horizontal direction, and a heater surrounding the inner tube and configured to adjust a temperature in the inner tube, wherein gas injection holes are formed corresponding to a height of the plurality of wafers in each of the plurality of nozzles, and a gas outlet is formed in a second outer portion in the inner tube, opposite to the first outer portion.

19 Claims, 18 Drawing Sheets

(52) U.S. Cl.
CPC .. *H01J 37/32715* (2013.01); *H01J 37/32834* (2013.01); *H01J 37/32899* (2013.01); *H01L 21/67069* (2013.01); *H01J 2237/201* (2013.01); *H01J 2237/334* (2013.01)

(58) Field of Classification Search
CPC ........... H01J 37/32834; H01J 37/32899; H01J 2237/201; H01J 2237/334; H01L 21/67069; H01L 21/02112; H01L 21/02205; H01L 21/02271; H01L 21/31116; H01L 21/67155; H01L 21/6719; H01L 21/67303; H01L 21/67757; C23C 16/45578
See application file for complete search history.

(56) References Cited

U.S. PATENT DOCUMENTS

| | | | |
|---|---|---|---|
| 11,094,572 | B2 | 8/2021 | Morita et al. |
| 2007/0259111 | A1 | 11/2007 | Singh et al. |
| 2010/0218724 | A1 | 9/2010 | Okada |
| 2011/0192820 | A1 | 8/2011 | Yeom et al. |
| 2012/0076936 | A1* | 3/2012 | Hirano ............... C23C 16/45563 118/724 |
| 2013/0327273 | A1* | 12/2013 | Okada ............... C23C 16/45578 118/715 |
| 2015/0197851 | A1* | 7/2015 | Yoon ................... H01J 37/3244 204/298.15 |
| 2016/0289833 | A1* | 10/2016 | Okada ............... C23C 16/45578 |
| 2017/0243755 | A1 | 8/2017 | Tapily |
| 2018/0315626 | A1* | 11/2018 | Franklin ................ F16J 15/062 |
| 2019/0189490 | A1* | 6/2019 | Morita ............. H01L 21/67309 |
| 2020/0071821 | A1* | 3/2020 | Shirako ............... H01L 21/6719 |
| 2020/0316645 | A1* | 10/2020 | George ............. H01L 21/3065 |
| 2021/0123137 | A1* | 4/2021 | Hatta ................ H01L 21/0228 |
| 2022/0372623 | A1* | 11/2022 | Harada .................. C07C 63/42 |
| 2023/0054580 | A1* | 2/2023 | Ie ...................... C23C 16/45544 |

FOREIGN PATENT DOCUMENTS

| | | | |
|---|---|---|---|
| KR | 10-2010-0098337 | A | 9/2010 |
| KR | 1020180058808 | A * | 6/2018 |
| KR | 101974417 | B1 | 5/2019 |
| KR | 10-2019-0074995 | A | 6/2019 |
| KR | 102165711 | B1 | 10/2020 |
| KR | 10-2021-0015944 | A | 2/2021 |

* cited by examiner

FIG. 4A
FIG. 4B
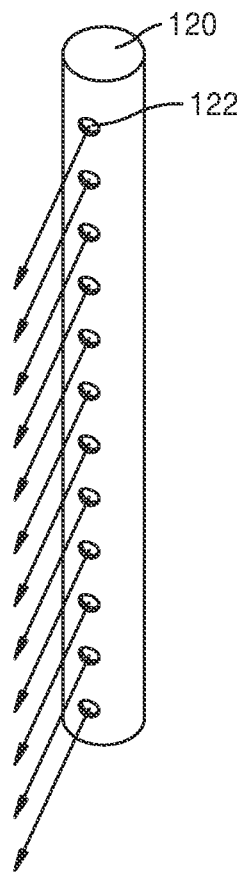
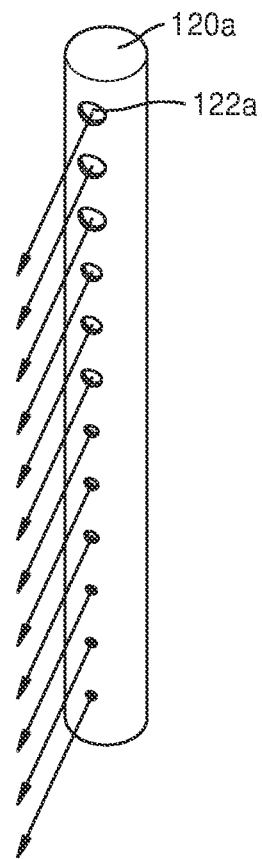

BATCH-TYPE APPARATUS FOR ATOMIC LAYER ETCHING (ALE), AND ALE METHOD AND SEMICONDUCTOR DEVICE MANUFACTURING METHOD BASED ON THE SAME APPARATUS

CROSS-REFERENCE TO THE RELATED APPLICATION

This application is based on and claims priority under 35 U.S.C. § 119 to Korean Patent Application No. 10-2021-0111874, filed on Aug. 24, 2021, in the Korean Intellectual Property Office, the disclosure of which is incorporated by reference herein in its entirety.

BACKGROUND

Embodiments of the present disclosure relate to an atomic layer etching (ALE) apparatus and method, and more particularly, to an ALE apparatus and method in which an ALE process may be performed simultaneously on a plurality of wafers.

As the geometries of structures on semiconductor substrates continue to decrease and types of structures evolve, etching challenges are increasing. One of the techniques used to solve this problem is ALE. Herein, ALE may refer to a technique that typically etches material layers with atomic precision. For example, ALE may remove one or several mono-molecular layers at a time. In general, the ALE process may proceed by chemically modifying a surface to be etched and then selectively removing the modified layer.

SUMMARY

Embodiments of the present disclosure provide a batch-type apparatus for atomic layer etching (ALE), which is capable of simultaneously ALE-processing several wafers, and an ALE method and a semiconductor device manufacturing method based on the batch-type apparatus.

A problem to be solved by embodiments of the present disclosure may not be limited to the foregoing, and other problems would be apparent to one of ordinary skill in the art from the following description.

According to one or more embodiments, a batch-type apparatus for atomic layer etching (ALE) is provided. The batch-type apparatus includes: a wafer stacking container that is configured to have therein a plurality of wafers that are arranged in a vertical direction, and the batch-type apparatus further including at least one process chamber. Each of the at least one process chamber including: an inner tube that extends in the vertical direction, and configured to include the wafer stacking container therein; a plurality of nozzles arranged in a first outer portion in the inner tube in a horizontal direction, the plurality of nozzles extending in the vertical direction and configured to supply a gas to the plurality of wafers; and a heater that surrounds the inner tube and is configured to adjust a temperature in the inner tube, wherein each of the plurality of nozzles includes a plurality of gas injection holes, the plurality of gas injection holes provided at heights corresponding to heights of the plurality of wafers, respectively, and wherein the inner tube includes a gas outlet in a second outer portion in the inner tube, opposite to the first outer portion in the horizontal direction.

According to one or more embodiments, a batch-type apparatus for atomic layer etching (ALE) is provided. The batch-type apparatus for ALE includes: a first process chamber of a batch type; a second process chamber of a batch type, arranged adjacent to the first process chamber; a gas supply configured to supply a gas to the first process chamber and the second process chamber; and a gas exhaust configured to discharge the gas from the first process chamber and the second process chamber. Each of the first process chamber and the second process chamber includes: a wafer stacking container that is configured to have therein a plurality of wafers that are arranged in a vertical direction, a process tube that extends in the vertical direction, the wafer stacking container inside the process tube, a plurality of nozzles arranged in a first outer portion in the process tube in a horizontal direction, the plurality of nozzles extending in the vertical direction and configured to supply the gas to the plurality of wafers, and a heater that surrounds the process tube and is configured to adjust a temperature of the process tube, wherein each of the plurality of nozzles includes a plurality of gas injection holes, the plurality of gas injection holes provided at heights corresponding to heights of the plurality of wafers, respectively, and wherein the process tube includes a gas outlet in a second outer portion in the process tube, opposite to the first outer portion in the horizontal direction.

An atomic layer etching (ALE) method is provided. The ALE method includes: performing, by a batch-type apparatus for ALE, a fluorination process of an ALE process by injecting a first source gas; and performing, by the batch-type apparatus for ALE, a ligand exchange process of the ALE process by injecting a second source gas. The the batch-type apparatus for ALE includes a wafer stacking container that has therein a plurality of wafers that are arranged in a vertical direction, and the batch-type apparatus for ALE further includes one or more process chambers. Each of the one or more process chambers includes: a process tube that extends in the vertical direction, the process tube configured to receive the wafer stacking container therein, a plurality of nozzles arranged in a first outer portion in the process tube in a horizontal direction, the plurality of nozzles extending in the vertical direction and configured to supply a gas to the plurality of wafers, and a heater that surrounds the process tube and is configured to adjust a temperature of the process tube, wherein the performing of the fluorination process includes supplying the first source gas through at least one of the plurality of nozzles of at least one from among the one or more process chambers, and the performing of the ligand exchange process includes supplying the second source gas through at least one of the plurality of nozzles of at least one from among the one or more process chambers.

According to one or more embodiments, a semiconductor device manufacturing method is provided. The semiconductor device manufacturing method includes: forming a dielectric film on a semiconductor substrate; crystallizing the dielectric film through heat treatment; performing an atomic layer etching (ALE) process on the dielectric film; determining whether a thickness of the dielectric film is less than or equal to a set target thickness; and performing a subsequent process on the semiconductor substrate based on determining that the thickness of the dielectric film is less than or equal to the set target thickness. The performing of the ALE process on the dielectric film includes: performing, by a batch-type apparatus for ALE, a fluorination process of the ALE process by injecting a first source gas; supplying a first purge gas; performing, by the batch-type apparatus for ALE, a ligand exchange process of the ALE process by injecting a second source gas; and supplying a second purge gas. The batch-type apparatus for ALE includes a wafer stacking container that has therein a plurality of wafers that are arranged in a vertical direction, and the batch-type apparatus for ALE further includes one or more process chambers. Each of the one or more process chambers includes: a process tube that extends in the vertical direction, the wafer stacking container configured to be inserted inside the process tube, a plurality of nozzles arranged in a first outer portion in the process tube in a horizontal direction, the plurality of nozzles extending in the vertical direction, and configured to supply a gas to the plurality of wafers, and a heater that surrounds the process tube and is configured to adjust a temperature of the process tube, wherein the performing of the fluorination process includes supplying the first source gas through at least one of the plurality of nozzles of at least one from among the one or more process chambers, and wherein the performing of the ligand exchange process includes supplying the second source gas through at least one of the plurality of nozzles of at least one from among the one or more process chambers.

BRIEF DESCRIPTION OF THE DRAWINGS

Embodiments of the present disclosure will be more clearly understood from the following detailed description taken in conjunction with the accompanying drawings in which:

FIG. 4A is a perspective view showing in more detail a shape of a nozzle in the batch-type apparatus for ALE of FIG. 1;

FIG. 4B is a perspective view showing in more detail a shape of a nozzle in the batch-type apparatus for ALE of FIG. 1;

DETAILED DESCRIPTION OF THE EMBODIMENTS

Figure 1:
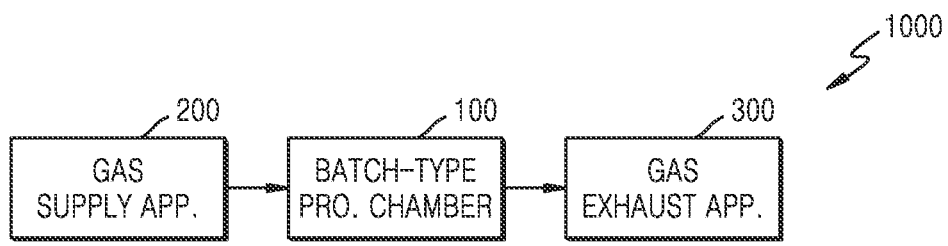
FIG. 1 is a block diagram of a batch-type apparatus for atomic layer etching (ALE), according to an embodiment of the present disclosure.

Hereinafter, embodiments of the present disclosure will be described in detail with reference to the accompanying drawings. Like components in the drawings will be referred to as like reference numerals, and may not be repeatedly described.

Figure 2A:
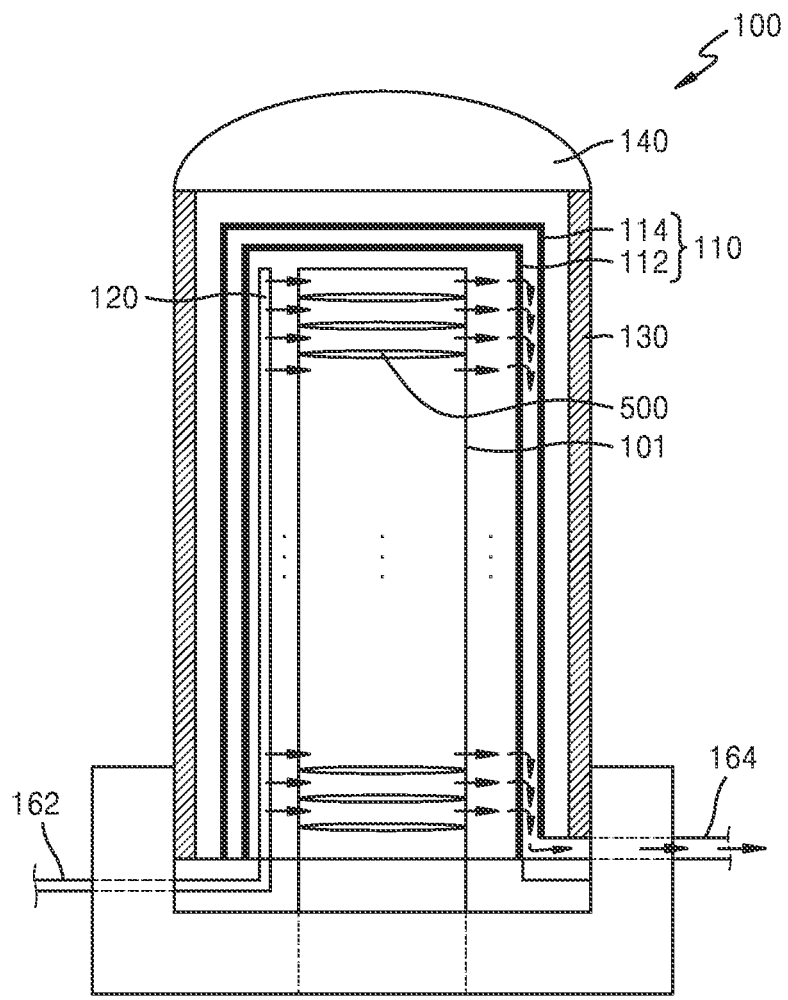
FIG. 2A is a vertical cross-sectional view of a process chamber in the batch-type apparatus for ALE of FIG. 1.
Figure 2B:
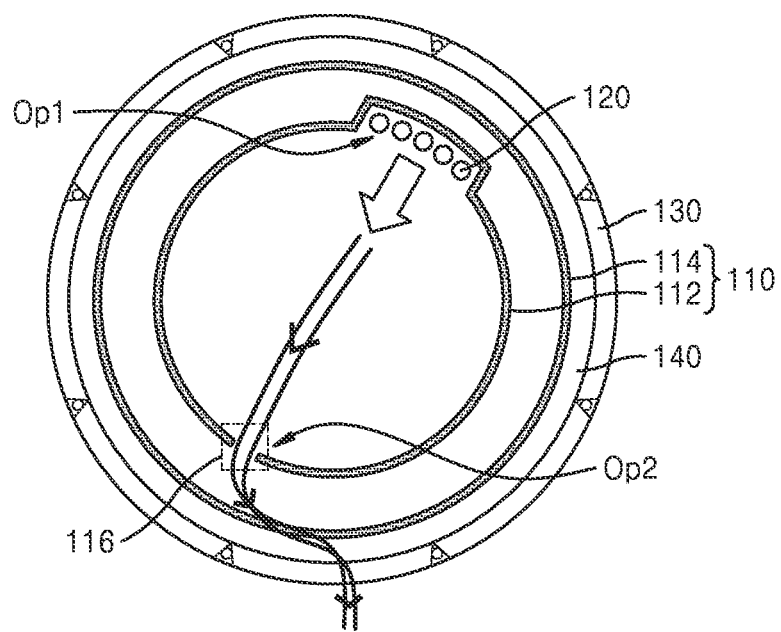
FIG. 2B is a horizontal cross-sectional view of the process chamber in the batch-type apparatus for ALE of FIG. 1.
Figure 2C:
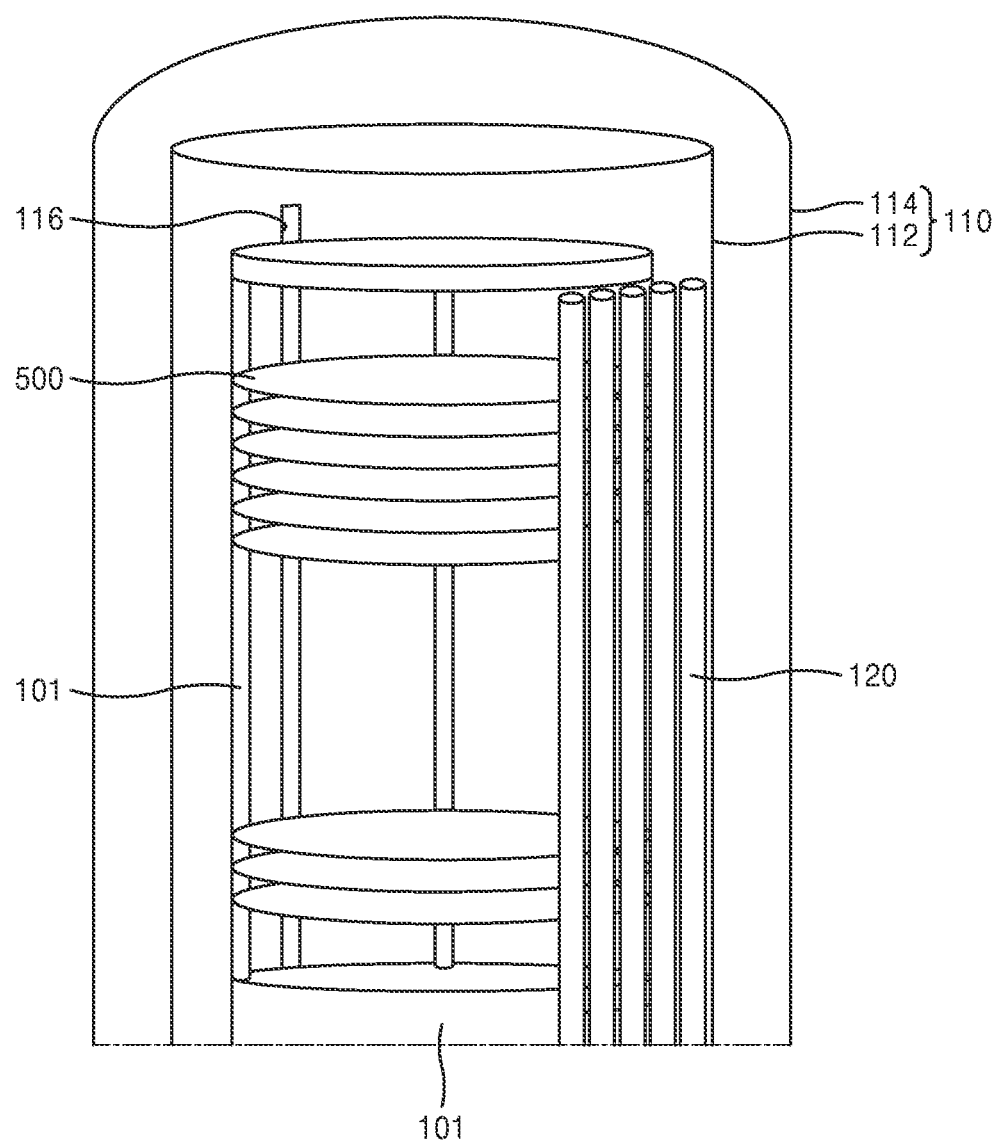
FIG. 2C is a perspective view of the process chamber in the batch-type apparatus for ALE of FIG. 1.

FIG. 1 is a block diagram of a batch-type apparatus for atomic layer etching (ALE), according to an embodiment of the present disclosure, and FIGS. 2A through 2C are respectively a vertical cross-sectional view, a horizontal cross-sectional view, and a perspective view of a process chamber in the batch-type apparatus for ALE of FIG. 1. FIG. 2C shows a wafer stacking container 101, a process tube 110, and a nozzle 120, omitting a heater and a chamber cover.

Referring to FIGS. 1 through 2C, a batch-type apparatus 1000 for ALE according to an embodiment may include a batch-type process chamber (hereinafter, simply referred to as a 'process chamber') 100, a gas supply apparatus 200 (also referred to as a 'gas supply'), and a gas exhaust apparatus 300 (also referred to as a 'gas exhaust').

The process chamber 100 may be a device capable of simultaneously performing an ALE process on a plurality of the wafer 500. The process chamber 100 may include the wafer stacking container 101, the process tube 110, the nozzle 120, a heater 130, and a chamber cover 140.

The wafer stacking container 101 may be a device that vertically stacks a wafer that is a target of an ALE process. For example, as illustrated in FIG. 2C, several tens of or several hundreds of the wafer 500 may be arranged at certain intervals in a vertical direction in the wafer stacking container 101. A structure of the wafer stacking container 101 is described in more detail with reference to FIGS. 6A through 6C.

The process tube 110 may be a vertical process tube having a cylindrical tube shape extending in the vertical direction. In the batch-type apparatus 1000 for ALE according to the current embodiment, the process tube 110 may include an inner tube 112 and an outer tube 114. The inner tube 112 may have the shape of a cylindrical tube extending in the vertical direction, and may have a closed top. The inner tube 112 may include a heat-resistant material, for example, quartz ($SiO_2$), silicon carbide (SiC), etc. However, a material of the inner tube 112 is not limited to the above-described materials. A processing space may be formed inside the inner tube 112. As a result, as shown in FIG. 2A or 2C, the wafer stacking container 101 may be inserted into the processing space of the inner tube 112. Although not shown, the process tube 110 may include a waiting room in a bottom portion of the inner tube 112, and the wafer stacking container 101 may be introduced into the waiting room from the outside of the process tube 110 before the ALE process and may be moved to the inner tube 112 to be arranged in the processing space of the inner tube 112.

The outer tube 114 may have a shape surrounding the inner tube 112. For example, the outer tube 114 may also have the shape of a cylindrical tube extending in the vertical direction, and may have a closed top. The outer tube 114 may include a heat-resistant material, for example, $SiO_2$, SiC, etc. However, a material of the outer tube 114 is not limited to the above-described materials. When process gases are injected into the inner tube 112 through the nozzle 120, and an exhaust gas is discharged through a gas outlet 116 of the inner tube 112, the exhaust gas may be discharged through a space between the inner tube 112 and the outer tube 114. Depending on an embodiment, the outer tube 114 may be omitted. For example, the process tube 110 may include the inner tube 112 without an outer tube, and the heater 130 and the chamber cover 140 may directly surround the inner tube 112.

The nozzle 120 may be a device that supplies a process gas to the wafer 500. Herein, the process gas may be a concept including a source gas, an atmospheric gas, a purge gas, etc. The process gas is described in more detail with reference to FIGS. 3A and 3B.

The nozzle 120 may be arranged in a first outer portion Op1 inside the inner tube 112. Herein, the first outer portion Op1 may be a relative concept with respect to a second outer portion Op2 that is adjacent to a portion of the inner tube 112 in which the gas outlet 116 is formed. Referring to FIG. 2B, a portion where the nozzle 120 is arranged may correspond to the first outer portion Op1 inside the inner tube 112, and a portion opposite to the first outer portion Op1 in a horizontal direction may correspond to the second outer portion Op2 inside the inner tube 112. As described above, the gas outlet 116 may be formed in a portion of the inner tube 112, at the second outer portion Op2.

The nozzle 120 may have a pipe column shape extending in the vertical direction. In addition, a plurality of gas injection holes (see gas injection hole 122 of FIG. 4A) may be formed in a side of the nozzle 120. The process gas may be injected into the inner tube 112 through a gas injection hole 122 and thus supplied onto the wafer 500. The shape of the nozzle 120 and the gas injection hole 122 is described in more detail with reference to FIGS. 4A to 4C.

The nozzle 120 may be arranged in plural inside the inner tube 112. For example, at least three nozzles 120 may be arranged inside the inner tube 112. More specifically, in the ALE process, the nozzle 120 may be divided into four types of nozzles according to functions. For example, the nozzle 120 may include a first source gas nozzle for supplying a first source gas for a fluorination process, a second source gas nozzle for supplying a second source gas for a ligand exchange process, an atmospheric gas nozzle for supplying an atmosphere gas, and a purge gas nozzle for supplying a purge gas. The fluorination process and the ligand exchange process are described in more detail with reference to FIGS. 3A and 3B.

In the batch-type apparatus 1000 for ALE according to the current embodiment, a plurality of nozzles 120 may be arranged inside the inner tube 112, and the plurality of nozzles 120 may include all of four types of nozzles. According to an embodiment, the plurality of nozzles 120 may include three types of nozzle. For example, the plurality of nozzles 120 may include the first source gas nozzle, the atmosphere gas nozzle, and the purge gas nozzle, or may include the second source gas nozzle, the atmosphere gas nozzle, and the purge gas nozzle. Moreover, according to an embodiment, the plurality of nozzles 120 may include three or four types of nozzle, but may include at least one type of nozzle in plural. For example, when the plurality of nozzles 120 include all of four types of nozzle, the first source gas nozzle and the second source gas nozzle may be included in plural, respectively. In addition, when the plurality of nozzles 120 include three types of nozzle, the first source gas nozzle or the second source gas nozzle may be included in plural.

The heater 130 may have a shape surrounding the process tube 110. Thus, the heater 130 may have a cylindrical tube shape similar to the process tube 110. The heater 130 may heat the inside of the inner tube 112 and the wafer 500 to an appropriate temperature. In other words, the heater 130 may heat the inside of the inner tube 112 and the wafer 500 to maintain the inside of the inner tube 112 at an appropriate temperature, thereby smoothly performing the ALE process.

The chamber cover 140 may cover an upper portion of the process chamber 100. According to an embodiment, a heater may be arranged inside the chamber cover 140. The chamber cover 140 may heat the upper space inside the inner tube 112 through the heater.

The gas supply apparatus 200 may be an apparatus that supplies a process gas to the process chamber 100. The process gas may be supplied from the gas supply apparatus 200 to the inside of the inner tube 112 through a supply pipe 162 and the nozzle 120. The gas supply apparatus 200 is described in more detail with reference to FIGS. 7A through 7C.

The gas exhaust apparatus 300 may be an apparatus that discharges the exhaust gas remaining in the process chamber 100 after a process. For example, the exhaust gas from the inner tube 112 may be delivered to the gas exhaust apparatus 300 through a passage between the inner tube 112 and the outer tube 114, and the exhaust pipe 164, and may be discharged to the outside through the gas exhaust apparatus 300. The gas exhaust apparatus 300 is described in more detail with reference to FIG. 8.

The batch-type apparatus 1000 for ALE according to the current embodiment may include the process chamber 100 having the process tube 110, which is vertical. Thus, the batch-type apparatus 1000 for ALE may simultaneously perform the ALE process on the plurality of the wafer 500. For example, the batch-type apparatus 1000 for ALE according to the current embodiment may simultaneously perform the ALE process on 25 through 100 wafers. For reference, a large number of wafers more than or equal to 50 wafers may be arranged at narrow intervals in the wafer stacking container 101 or a small number of wafers less than 50 wafers may be arranged at wide intervals in the wafer stacking container 101. When a large number of wafers are arranged within the wafer stacking container 101, a large number of wafers may be processed at a time, thereby increasing a processing speed of wafers. When a small number of wafers are arranged inside the wafer stacking container 101, an interval between wafers may increase and a flow of process gases may be smooth to achieve a uniform process, thereby improving reliability. Thus, according to a type of an ALE process, the number of the wafer 500 arranged inside the wafer stacking container 101 may be properly adjusted, thus optimizing processing speed and reliability.

Figure 9A:
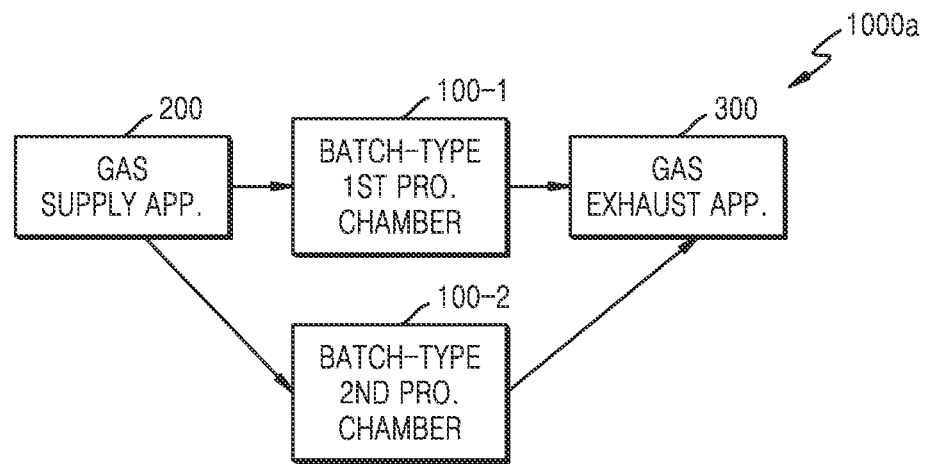
FIG. 9A is a block diagram of a batch-type apparatus for ALE, according to an embodiment of the present disclosure.
Figure 9B:
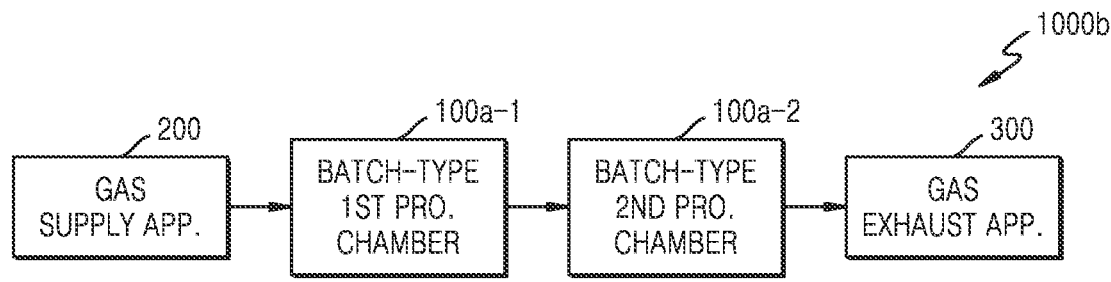
FIG. 9B is a block diagram of a batch-type apparatus for ALE, according to an embodiment of the present disclosure.
Figure 9C:
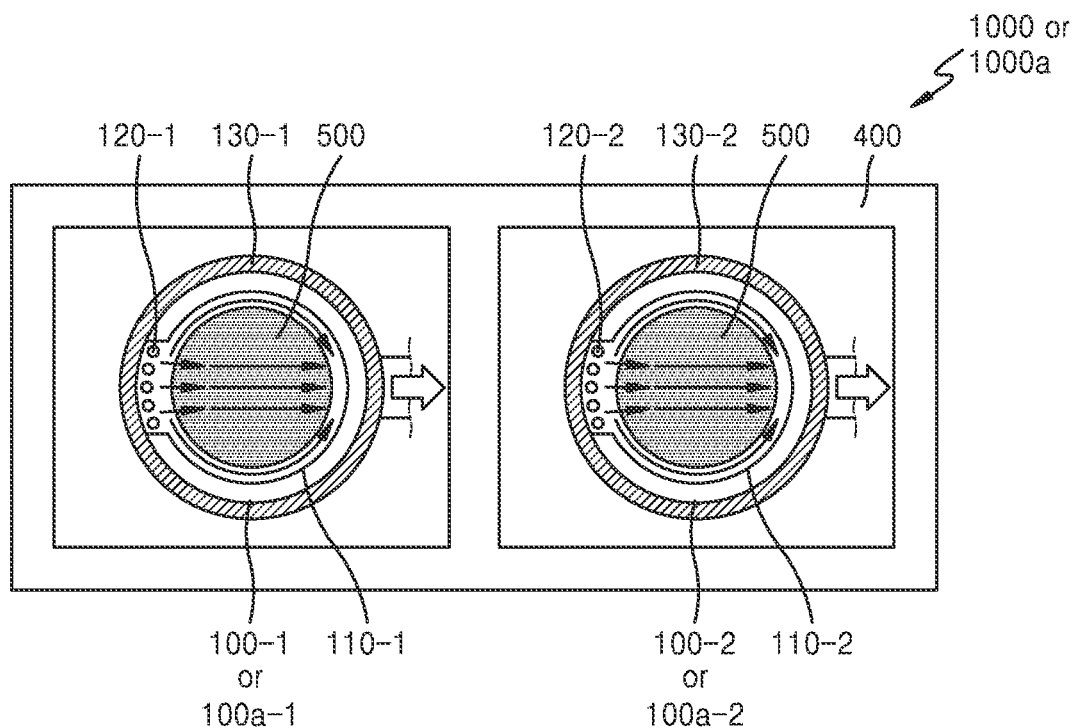
FIG. 9C is a conceptual view of a batch-type apparatus for ALE, according to an embodiment of the present disclosure.

In addition, with reference to FIGS. 9A to 9C, a batch-type apparatus 1000a and a batch-type apparatus 1000b for ALE according to embodiments may include two process chambers, for example, a first process chamber 100-1 and a second process chamber 100-2, having a dual tube structure. Consequently, the batch-type apparatus 1000a and the batch-type apparatus 1000b for ALE according to embodiments may perform an ALE process in each of the two process chambers, that is, the first process chamber 100-1 and the second process chamber 100-2, when a process temperature for each operation of the ALE process is identical. In addition, when the process temperature for each operation of the ALE process is different, the ALE process may be performed by performing a pre-process in the first process chamber 100-1 and performing a post-process in the second process chamber 100-2. Thus, the batch-type apparatus 1000a and the batch-type apparatus 1000b for ALE according to embodiments may efficiently perform the ALE process on the plurality of the wafer 500 in correspondence to the process temperature for each operation of the ALE process.

Figure 3A:
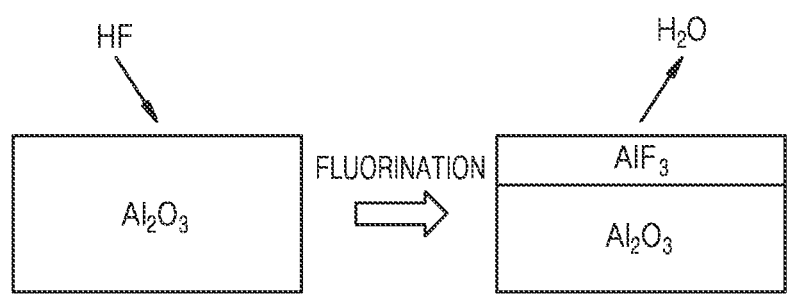
FIG. 3A is a conceptual view showing a procedure of an ALE process in the batch-type apparatus for ALE of FIG. 1.
Figure 3B:
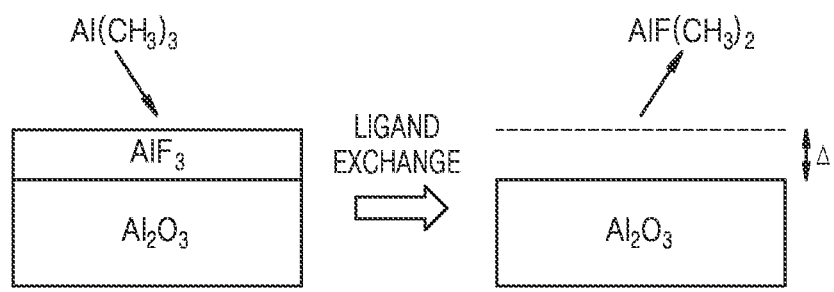
FIG. 3B is a conceptual view showing a procedure of an ALE process in the batch-type apparatus for ALE of FIG. 1.

FIGS. 3A and 3B are conceptual views showing a procedure of an ALE process in the batch-type apparatus for ALE of FIG. 1. A description will be made with reference to FIGS. 1 through 2C together. In the batch-type apparatus for ALE according to embodiments, the ALE process proceeds through two operations, in which FIG. 3A shows a first operation of the two operations and FIG. 3B shows a second operation of the two operations.

Referring to FIG. 3A, first, in the first operation of the ALE process, a fluorination process may be performed by supplying a fluorine gas and adsorbing the fluorine gas to a crystalline metal oxide thin film. In FIG. 3A, HF is an example of the fluorine gas of the fluorination process, the fluorine gas is not limited to HF. For example, the fluorine gas may include $SF_4$, $XeF_4$, etc. In addition, although an aluminum oxide ($Al_2O_3$) thin film is an example of a target thin film of the ALE process, the target thin film of the ALE process is not limited thereto. For example, the target thin film of the ALE process may include a metal-based dielectric film such as various metal oxide thin films, metal nitride thin films, etc., or a high-dielectric (high-k) film.

For reference, the metal oxide thin film or metal nitride thin film used in recent semiconductor devices may need to be uniformly deposited in a complex or deep and narrow 3D structure. Moreover, to improve characteristics of a semiconductor device, a film may need to be formed to a thin thickness of 50 Å or less. To form such a thin thickness, generally, a metal oxide thin film or a metal nitride thin film may be deposited in an amorphous state and crystallization may be performed through a subsequent heat treatment process. However, as the thickness of the thin film decreases, a subsequent heat treatment process temperature may increase. Thus, in a deep or high 3D structure having a high-level difference and a narrow width, a defect of the bending of a structure or a bridge failure of adhering to an adjacent structure may be caused by thermal stress during a subsequent crystallization process corresponding to the heat treatment process.

To solve the foregoing problem, a method may be introduced in which a metal oxide thin film or a metal nitride thin film is formed thicker than 50 Å to reduce a crystallization temperature, thus suppressing structural defects due to thermal stress in the crystallization process. However, in this method, an etching process for reducing a metal oxide thin film or a metal nitride thin film to a required thickness, for example, 50 Å or less, may be performed, and an ALE process may be generally performed. For reference, when a metal-based dielectric film or a high-dielectric film is less than or equal to 50 Å, the crystallization temperature may be very high, such as 500° C. to 600° C. However, when the high-dielectric film is formed relatively thick exceeding 50 Å, the crystallization temperature may be lowered to 400° C. or less.

Through the fluorination process for the $Al_2O_3$ thin film, an upper portion of the $Al_2O_3$ thin film may be converted into an $AlF_3$ thin film, as shown in FIG. 3A. Thereafter, the remaining residual gas may be purged with an inert gas such as $N_2$, Ar, etc. After purging, the inert gas, as an exhaust gas, may be discharged to the outside of the process chamber 100 through the gas exhaust apparatus 300. For reference, the inert gas may also be referred to as a purge gas due to a purge action.

Referring to FIG. 3B, next, in a second operation of the ALE process, a gas such as $TMA(Al(CH_3)_3)$, etc., may be supplied to perform a ligand exchange process. A part of a metal oxide thin film, e.g., an $Al_2O_3$ thin film, may be etched through the ligand exchange process. In FIG. 3B, a thickness removed through the ligand exchange process is indicated by A. A may be less than or equal to, for example, several Å.

Trimethylamine (TMA) is used as an example of a gas for the ligand exchange process, but the gas used in the ligand exchange process is not limited to TMA. For example, $Sn(acac)_2$, $Al(CH_3)_2Cl$, $SiCl_4$, $TiCl_4$, $BCl_3$, $WF_6$, etc., may be used as the gas for the ligand exchange process. Herein, in $Sn(acac)_2$, acac may mean $CH_3COCH_2COCH_3$.

Thereafter, reaction by-products may be purged with an inert gas and discharged as an exhaust gas, completing one cycle of the ALE process. The cycle of the ALE process may be repeated several times until the metal oxide or metal nitride thin film reaches a desired thickness.

For reference, generally, a gas directly used for reaction in a corresponding process may be referred to as a source gas or a reaction gas. For example, a fluorine gas may correspond to a source gas of a fluorination process. Moreover, $Sn(acac)_2$, $Al(CH_3)_2Cl$, $SiCl_4$, $TiCl_4$, $BCl_3$, $WF_6$, etc., as well as TMA, etc., may be the source gas for the ligand exchange process. In addition, the corresponding process may further include an atmosphere gas in addition to the source gas. The atmosphere gas may include, for example, $O_2$, $O_3$, $N_2$, Ar, or the like. Needless to say, the type of the atmosphere gas is not limited to the above-described gases. Moreover, to remove residual gases and by-products in a corresponding process, an inert gas such as $N_2$, Ar, etc., may be used as a purge gas. As described above, the process gas may be a concept including a source gas, an atmosphere gas, and a purge gas, and may be used as the same concept below.

Figure 4C:
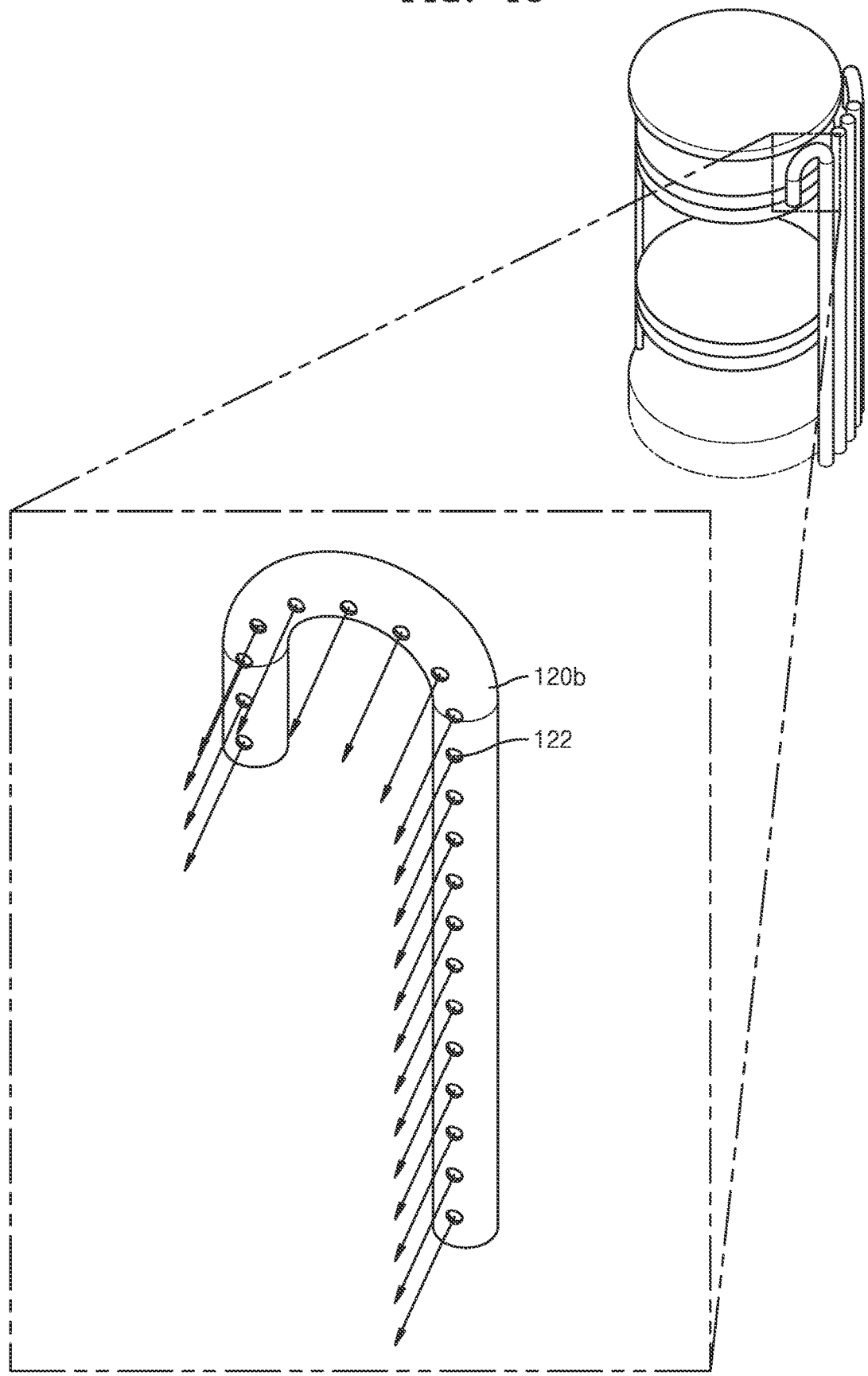
FIG. 4C is a perspective view showing in more detail a shape of a nozzle in the batch-type apparatus for ALE of FIG. 1.

FIGS. 4A through 4C are perspective views showing in detail a shape of a nozzle in the batch-type apparatus for ALE of FIG. 1. A description will be made with reference to FIGS. 2A through 2C together.

Referring to FIG. 4A, in the batch-type apparatus 1000 for ALE according to an embodiment, the process chamber 100 may include a nozzle 120 for supplying the process gas into the inner tube 112. The nozzle 120 may include a plurality of the gas injection hole 122 for injecting the process gas, as shown in FIG. 4A. The plurality of the gas injection hole 122 may be arranged at equal intervals in a vertical direction. In addition, the plurality of the gas injection hole 122 may substantially have the same size. In the vertical direction, positions of the plurality of the gas injection hole 122 in the nozzle 120 may correspond to positions between wafers that are arranged in the wafer stacking container 101. In addition, the plurality of the gas injection hole 122 may be directed toward the center of the inner tube 112. That is, the nozzle 120 may be arranged outside the wafer stacking container 101, and the plurality of the gas injection hole 122 of the nozzle 120 may be directed toward a wafer arranged in the wafer stacking container 101. In FIG. 4A, arrows may indicate a direction in which the plurality of the gas injection hole 122 is directed or a direction in which the process gas is injected, and may be directed to the wafer.

Referring to FIG. 4B, in the batch-type apparatus 1000 for ALE according to an embodiment, the process chamber 100 may include a nozzle 120a for supplying the process gas into the inner tube 112. A nozzle 120a may include a plurality of a gas injection hole 122a. Unlike the plurality of the gas injection hole 122 of the nozzle 120 of FIG. 4A, the plurality of the gas injection hole 122a may increase in size in an upward direction. In FIG. 4B, the size of every three of the plurality of the gas injection hole 122a increases in the upward direction, but an increasing pattern of the sizes of the plurality of the gas injection hole 122a is not limited thereto. For example, the size of every two or four of the plurality of the gas injection hole 122a or the size of each of the plurality of the gas injection hole 122a may increase in the upward direction. In addition, the plurality of the gas injection hole 122a may be directed toward the center of the inner tube 112. That is, the nozzle 120a may be arranged outside the wafer stacking container 101, and the plurality of the gas injection hole 122a of the nozzle 120a may be directed toward a wafer arranged in the wafer stacking container 101. In FIG. 4B, arrows may indicate a direction in which the plurality of the gas injection hole 122a is directed or a direction in which the process gas is injected, and may be directed to the wafer.

For reference, as may be seen from FIG. 2A, the process gas may be supplied into the process chamber 100 through a lower portion of the process chamber 100. Thus, a gas pressure of an upper portion of the nozzle 120a may be lower than that of a lower portion thereof. By increasing the size of the plurality of the gas injection holes 122a of the upper portion of the nozzle 120a, the injection amount of the process gas may be uniform for each position in the vertical direction. As a result, due to the uniformly supplied process gas, the ALE process may be performed uniformly and smoothly on each of wafers.

Referring to FIG. 4C, in the batch-type apparatus 1000 for ALE according to an embodiment, the process chamber 100 may include nozzles 120 and 120b for supplying the process gas into the inner tube 112. The nozzles 120 and 120b may include the plurality of gas injection holes 122. At least one nozzle 120b of the nozzles 120 and 120b, for example, the nozzles 120b on both outer sides, may have an inverted U shape in an upper portion, unlike the nozzles 120 in a center portion. The nozzles 120b may have an inverted U shape in the upper portion, such that the injection amount of the process gas increases in the upper portion, and accordingly, the injection amount of the process gas may be uniform for each position in the vertical direction. As a result, due to the uniformly supplied process gas, the ALE process may be performed uniformly and smoothly on each of wafers. In addition, the plurality of the gas injection hole 122 may be directed toward the center of the inner tube 112. That is, the nozzle 120 and the nozzle 120b may be arranged outside the wafer stacking container 101, and the plurality of the gas injection hole 122 of the nozzle 120 and the nozzle 120b may be directed toward a wafer arranged in the wafer stacking container 101. In FIG. 4C, arrows may indicate a direction in which the plurality of the gas injection hole 122 is directed or a direction in which the process gas is injected, and may be directed to the wafer.

Figure 5A:
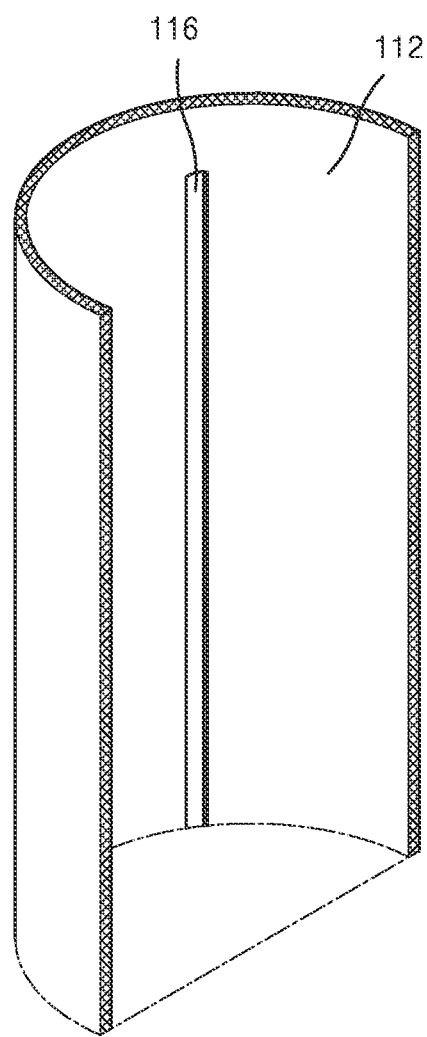
FIG. 5A is a vertical cross-sectional view showing in more detail a shape of a gas outlet formed in an inner tube, in the batch-type apparatus for ALE of FIG. 1.
Figure 5B:
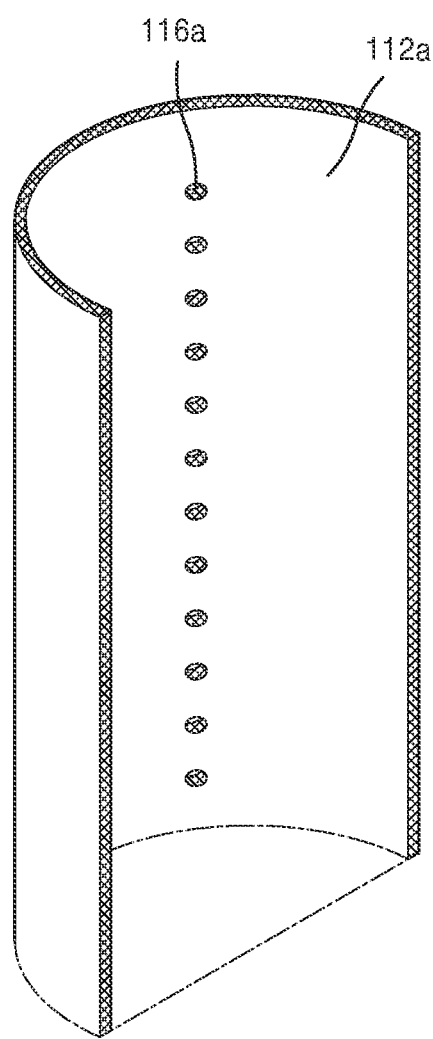
FIG. 5B is a vertical cross-sectional view showing in more detail a shape of a gas outlet formed in an inner tube, in the batch-type apparatus for ALE of FIG. 1.
Figure 5C:
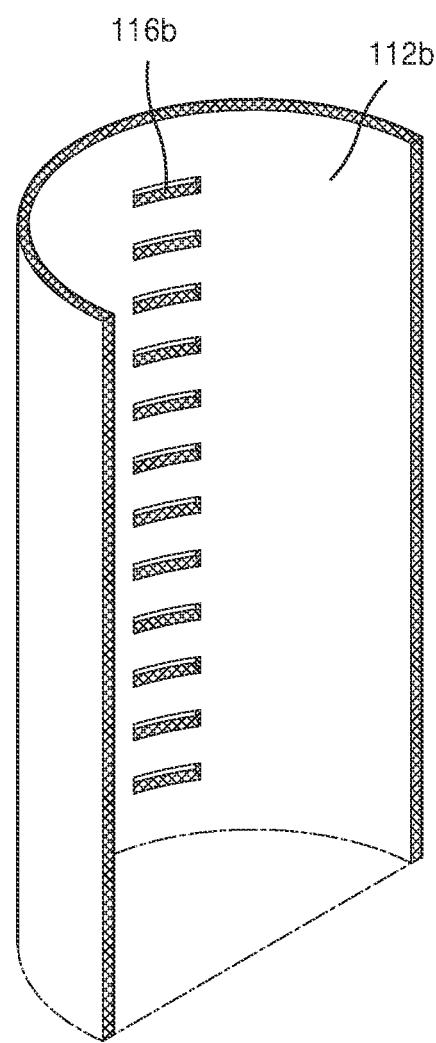
FIG. 5C is a vertical cross-sectional view showing in more detail a shape of a gas outlet formed in an inner tube, in the batch-type apparatus for ALE of FIG. 1.

FIGS. 5A through 5C are vertical cross-sectional views showing in detail a shape of a gas outlet formed in an inner tube, in the batch-type apparatus for ALE of FIG. 1. A description will be made with reference to FIGS. 2A through 2C together.

Referring to FIG. 5A, in the batch-type apparatus 1000 for ALE according to an embodiment, the process chamber 100 may include the inner tube 112 in which the gas outlet 116 may be formed. In addition, a top of the inner tube 112 may have a closed structure, but is shown as an open structure in FIG. 5A for convenience of understanding. Hereinbelow, this may also be applied to FIGS. 5B and 5C.

As shown in FIG. 5A, the gas outlet 116 may be formed as a slit in the form of a line extending in the vertical direction. According to an embodiment, the gas outlet 116 may include a plurality of slits in the form of a line. For example, a plurality of slits may be arranged in the vertical direction or a plurality of slits may be arranged in an arc direction. As described with reference to FIG. 2B, the gas outlet 116 may be formed in the inner tube 112 of the second outer portion Op2 opposing the first outer portion Op1 in which the nozzle 120 is arranged.

Referring to FIG. 5B, in the batch-type apparatus 1000 for ALE according to an embodiment, the process chamber 100 may include an inner tube 112a in which a gas outlet 116a may be formed. As shown in FIG. 5B, the gas outlet 116a may be formed as a plurality of holes arranged in the vertical direction. In FIG. 5B, the plurality of holes are arranged in one column, but the arrangement structure of the plurality of holes is not limited thereto. For example, the plurality of holes of the gas outlet 116a may be arranged in two or more columns.

Referring to FIG. 5C, in the batch-type apparatus 1000 for ALE according to an embodiment, the process chamber 100 may include an inner tube 112b in which a gas outlet 116b may be formed. As shown in FIG. 5C, the gas outlet 116b may be formed as a plurality of open lines arranged in the vertical direction. Each of the plurality of open lines may have a form extending in the arc direction. In the vertical direction, positions of the plurality of open lines in the inner tube 112b may correspond to positions between wafers that are arranged in the wafer stacking container 101.

Figure 6A:
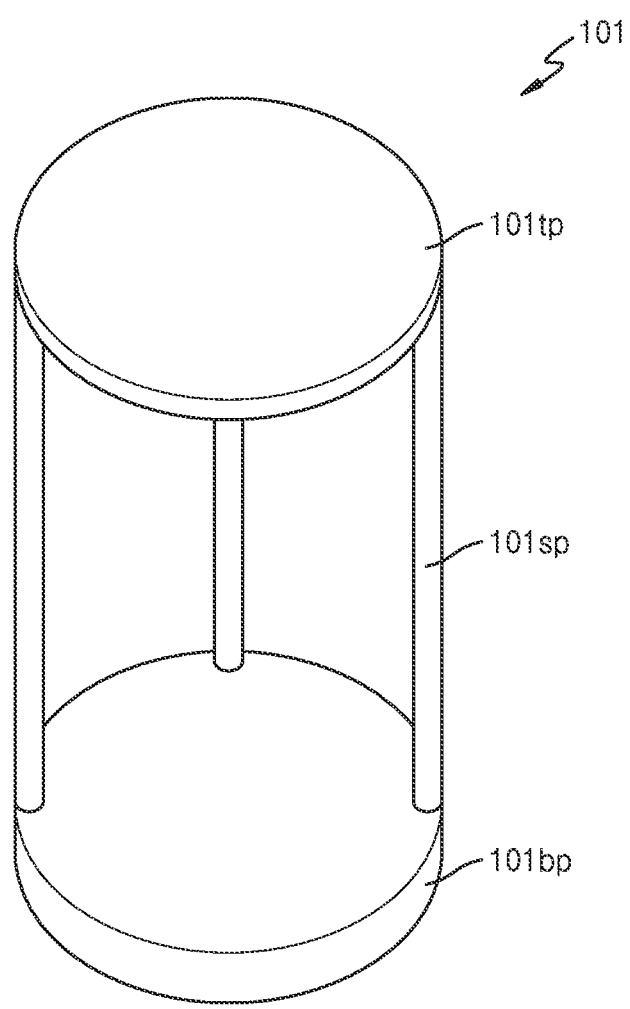
FIG. 6A is a perspective view of a wafer stacking container, in the batch-type apparatus for ALE of FIG. 1.
Figure 6B:
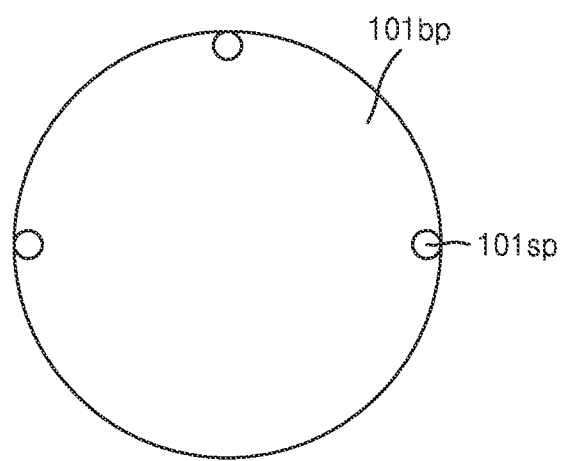
FIG. 6B is a plane view of the wafer stacking container, in the batch-type apparatus for ALE of FIG. 1.
Figure 6C:
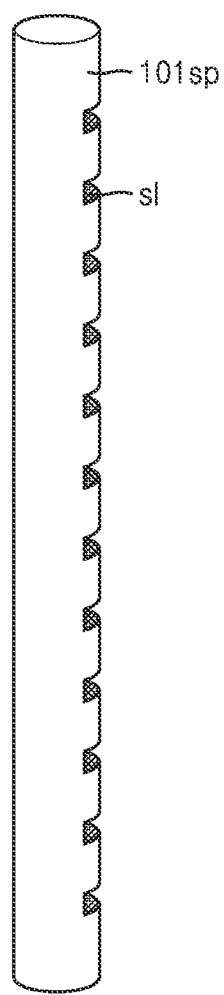
FIG. 6C is a perspective view of the wafer stacking container, in the batch-type apparatus for ALE of FIG. 1.

FIGS. 6A through 6C are a perspective view, a plane view, and a partial enlarged view of a wafer stacking container, in the batch-type apparatus for ALE of FIG. 1. FIG. 6B is a plan view of a wafer stacking container of FIG. 6A from which a circular top plate is removed, viewed from top, and FIG. 6C is a partially enlarged view showing a part of a support pillar in the wafer stacking container of FIG. 6A. A description will be made with reference to FIGS. 2A through 2C together.

Referring to FIGS. 6A through 6C, in the batch-type apparatus 1000 for ALE according to an embodiment, the process chamber 100 may include the wafer stacking container 101 arranged inside the inner tube 112. The wafer stacking container 101 may include a circular bottom plate 101bp, three support pillars 101sp, and a circular top plate 101tp. The circular bottom plate 101bp and the circular top plate 101tp may connect the three support pillars 101sp arranged therebetween. Thus, the circular bottom plate 101bp and the circular top plate 101tp may have a shape of a circular ring, instead of the shape of a circular plate. To support the shape of the circular ring, a grid, a support line, etc., may be arranged inside the circular ring.

As shown in FIG. 6B, out of the three support pillars 101sp, two may be arranged in a portion corresponding to a diameter of the circular bottom plate 101bp and one may be arranged between the two. The three support pillars 101sp may be arranged in such a shape to support a wafer 500 by the three support pillars 101sp and allow the wafer 500 to enter and exit from the wafer stacking container 101.

As shown in FIG. 6C, a plurality of slots sl may be formed in each of the three support pillars 101sp. The plurality of slots sl may be arranged at equal intervals in the vertical direction. The plurality of slots sl may face a center portion of the wafer stacking container 101. The wafer 500 may be inserted into a slot of each of the three support pillars 101sp and may be arranged in the wafer stacking container 101.

Meanwhile, the support pillars 101sp are illustrated in the form of a cylinder, but the support pillars 101sp are not limited to the form of a cylinder. For example, the support pillars 101sp may have a shape of a polygonal pillar, such as a trigonal prism, a square pillar, etc., or the shape of a cylindroid. Furthermore, in the batch-type apparatus 1000 for ALE according to an embodiment, the structure of the wafer stacking container 101 is not limited to the structure shown in FIG. 6A and may be variously changed and replaced. For example, the wafer stacking container 101 may be replaced with various other structures in which a plurality of the wafer 500 may be stacked in the vertical direction and inserted into the inner tube 112.

Figure 7A:
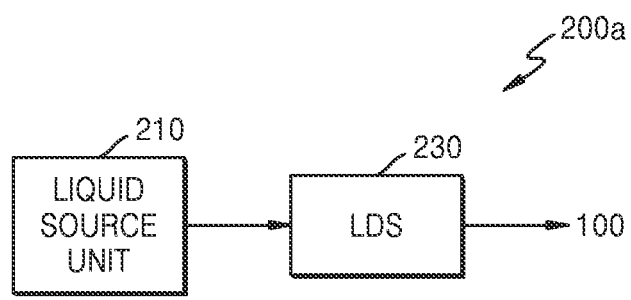
FIG. 7A is a block diagram of a gas supply apparatus, in the batch-type apparatus for ALE of FIG. 1.
Figure 7B:
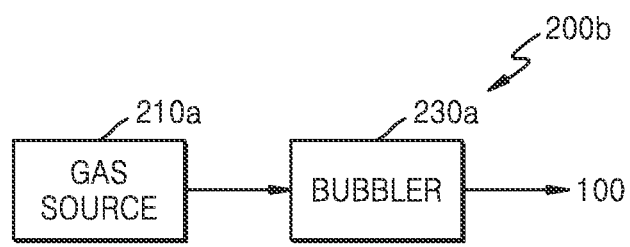
FIG. 7B is a block diagram of a gas supply apparatus, in the batch-type apparatus for ALE of FIG. 1.
Figure 7C:
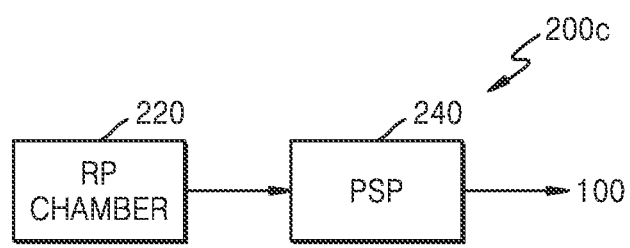
FIG. 7C is a block diagram of a gas supply apparatus, in the batch-type apparatus for ALE of FIG. 1.

FIGS. 7A through 7C are block diagrams of a gas supply apparatus, in the batch-type apparatus for ALE of FIG. 1. A description will be made with reference to FIGS. 1 through 2C together.

Referring to FIG. 7A, in the batch-type apparatus 1000 for ALE according to an embodiment, a gas supply apparatus 200a may include a liquid source unit 210 and a liquid delivery system (LDS) 230. The liquid source unit 210 may store a source in a liquid state, that is, a liquid source, and supply the liquid source to the LDS 230. The LDS 230 may be a device or a system that delivers the liquid source to the process chamber 100. For example, the LDS 230 may include a liquid mass flow controller (LMFC) and a vaporizer. The LMFC may control the flow of the liquid source in a supply pipe, and the vaporizer may convert the liquid source into a gas source. In other words, the LDS 230 may convert a liquid source into a gas source and supply the gas source to the process chamber 100 using the LMFC and the vaporizer. The gas source may be substantially the same as the above-described source gas.

In FIG. 7A, the gas supply apparatus 200a is illustrated as including the liquid source unit 210, but a source unit included in the gas supply apparatus 200a is not limited thereto. For example, the gas supply apparatus 200a may further include other source units that store and supply an atmosphere gas, a purge gas, etc.

Referring to FIG. 7B, in the batch-type apparatus 1000 for ALE according to an embodiment, a gas supply apparatus 200b may include a gas source unit 210a and a bubbler 230a. The gas source unit 210a may store a source in a gas state, that is, a gas source, and supply the gas source, that is, the source gas, to the bubbler 230a. The bubbler 230a may be a device for delivering a gas source to the process chamber 100 and may correspond to the LDS 230 or the LMFC. In addition, a vaporizer may be unnecessary because the gas source is already in the gas state. Moreover, the gas supply apparatus 200b according to an embodiment may also further include other source units that store and supply an atmosphere gas, a purge gas, etc.

Referring to FIG. 7C, in the batch-type apparatus 1000 for ALE according to an embodiment, a gas supply apparatus 200c may include a remote plasma (RP) device. More specifically, the gas supply apparatus 200c may include an RP chamber 220 and a plasma supply pipe (PSP) 240. In addition, although not shown, the gas supply apparatus 200c may further include other source units that store and supply an atmosphere gas, a purge gas, etc.

The RP chamber 220, which is a plasma chamber arranged in a position apart from the process chamber 100, may generate plasma. For example, the RP chamber 220 may generate plasma using a fluorine gas such as $NF_3$, $CF_4$, etc. The PSP 240 may supply plasma generated in the RP chamber 220 to the process chamber 100.

For reference, when plasma is generated in the RP chamber 220, various components such as radicals, electrons, ions, ultraviolet rays, etc., may be generated. At least one of the components may be used for an etching process, a deposition process, a cleaning process, etc. Basically, a radical may be electrically neutral and an ion may electrically have a polarity. Thus, when a plasma is used for the etching process, the radical may be used for isotropic etching of an etching target and the ion may be used for anisotropic etching of the etching target. When radicals or ions are used in the etching process, components other than the corresponding component may be removed. When the PSP 240 supplies plasma to the process chamber 100, components unnecessary for the etching process may be removed, and only radicals or ions required for the etching process may be supplied to the process chamber 100.

Figure 8:
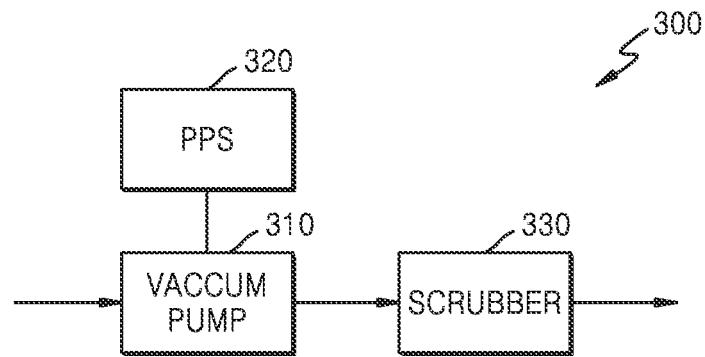
FIG. 8 is a block diagram of a gas exhaust apparatus, in the batch-type apparatus for ALE of FIG. 1.

FIG. 8 is a block diagram of a gas exhaust apparatus, in the batch-type apparatus for ALE of FIG. 1. A description will be made with reference to FIGS. 1 through 2C together.

Referring to FIG. 8, in the batch-type apparatus 1000 for ALE according to an embodiment, the gas exhaust apparatus 300 may include a vacuum pump 310, a portable purge system (PPS) 320, and a scrubber 330. The vacuum pump 310, which is a vacuum exhaust device, may discharge the exhaust gas in the process chamber 100 through vacuum suction. The PPS 320 is a device for burning a residual reaction gas. The scrubber 330 is a device for diluting/neutralizing a by-product gas. That is, the scrubber 330 may dilute/neutralize a harmful by-product gas of the exhaust gas. The exhaust gas may be discharged to the outside of the batch-type apparatus 1000 for ALE via the scrubber 330.

FIGS. 9A through 9C are block diagrams and a conceptual view of a batch-type apparatus for ALE, according to embodiments of the present disclosure. A description will be made with reference to FIGS. 1 through 2C together.

Referring to FIGS. 9A and 9C, a batch-type apparatus 1000a for ALE according to an embodiment may be different from the batch-type apparatus 1000 for ALE of FIG. 1 in that the batch-type apparatus 1000a includes two batch-type process chambers, for example, a first process chamber 100-1 and a second process chamber 100-2. More specifically, the batch-type apparatus 1000a for ALE according to an embodiment may include the first process chamber 100-1, the second process chamber 100-2, the gas supply apparatus 200, and the gas exhaust apparatus 300. The gas supply apparatus 200 is the same as described with reference to FIGS. 1 through 2C and 7A through 7C. The gas exhaust apparatus 300 is the same as described with reference to FIGS. 1 through 2C and 8.

Each of the first process chamber 100-1 and the second process chamber 100-2 may have substantially the same structure as the process chamber 100 of the batch-type apparatus 1000 for ALE of FIG. 1. Accordingly, the first process chamber 100-1 may include a first process tube 110-1, a first nozzle 120-1, and a first heater 130-1. Accordingly, the second process chamber 100-2 may include a second process tube 110-2, a second nozzle 120-2, and a second heater 130-2. In addition, each of the first process chamber 100-1 and the second process chamber 100-2 may include the wafer stacking container 101 and a chamber cover 140, which are not shown in FIG. 9C.

Each of the first process chamber 100-1 and the second process chamber 100-2 may perform the ALE process. Accordingly, a plurality of first nozzles 120-1 may include all four types of nozzle. Moreover, a plurality of second nozzles 120-2 may include all four types of nozzle. More specifically, in the batch-type apparatus 1000a for ALE according to an embodiment, the process temperatures of the two operations of the ALE process, for example, the fluorination process and the ligand exchange process, may be substantially the same as each other. Accordingly, both the two-operation process may be performed in each of the first process chamber 100-1 and the second process chamber 100-2 because there is no need to change the process temperatures between the fluorination process and the ligand exchange process.

The batch-type apparatus 1000a for ALE according to an embodiment may include the two process chambers, that is, the first process chamber 100-1 and the second process chamber 100-2, each of which performs the ALE process, thereby maximizing the processing speed of the ALE process on the plurality of the wafer 500. Also, the batch-type apparatus 1000a for ALE according to an embodiment may be used when the processes of the first and second operations of the ALE process have substantially the same process temperature, and the ALE process may be performed smoothly and quickly because there is no need to change the process temperatures between the processes of the first operation and the second operation.

For reference, element 400 in FIG. 9C may be a housing accommodating the first process chamber 100-1 and the second process chamber 100-2. In addition, a black arrow may indicate a traveling direction of the process gas including the source gas, and a large white arrow may indicate a traveling direction of the exhaust gas discharged from each of the two process chambers, that is, the first process chamber 100-1 and the second process chamber 100-2.

Referring to FIGS. 9B and 9C, a batch-type apparatus 1000b for ALE according to an embodiment may be similar to the batch-type apparatus 1000a for ALE of FIG. 9A in that the batch-type apparatus 1000b includes two process chambers, for example, a first process chamber 100a-1 and a second process chamber 100a-2. However, the batch-type apparatus 1000b for ALE according to an embodiment may be different from the batch-type apparatus 1000a for ALE of FIG. 9A in terms of a structure and an operation of each of the two process chambers, that is, the first process chamber 100a-1 and the second process chamber 100a-2. More specifically, in the batch-type apparatus 1000b for ALE according to an embodiment, a plurality of first nozzles 120-1 of the first process chamber 100a-1 may include three types of nozzle. For example, the plurality of first nozzles 120-1 may include the first source gas nozzle, the atmosphere gas nozzle, and the purge gas nozzle. In addition, a plurality of second nozzles 120-2 of the second process chamber 100a-2 may include three types of nozzles, but may have different types from the plurality of first nozzles 120-1. For example, the plurality of second nozzles 120-2 may include the second source gas nozzle, the atmosphere gas nozzle, and the purge gas nozzle. Here, the first source gas nozzle may supply the first source gas used in the fluorination process, and the second source gas nozzle may supply the second source gas used in the ligand exchange process.

The batch-type apparatus 1000b for ALE according to an embodiment may have the configurations of the first process chamber 100a-1 and the second process chamber 100a-2 described above, and the fluorination process of the ALE process is performed in the first process chamber 100a-1 and the ligand exchange process of the ALE process may be performed in the second process chamber 100a-2. More specifically, in the batch-type apparatus 1000b for ALE according to an embodiment, the process temperatures of the fluorination process and the ligand exchange process of the ALE process may be different from each other. Accordingly, the fluorination process may be performed in the first process chamber 100a-1 at a first process temperature, and then, the ligand exchange process may be performed in the second process chamber 100a-2 at a second process temperature. When the fluorination process is completed in the first process chamber 100a-1, the wafer stacking container 101 containing the corresponding wafers may be moved to the second process chamber 100a-2, and the ligand exchange process may be performed in the second process chamber 100a-2, thus performing the ALE process.

When the batch-type apparatus 1000b for ALE according to an embodiment include the two process chambers, that is, the first process chamber 100a-1 and the second process chamber 100a-2, and the processes of the first and second operations of the ALE process have different process temperatures, a corresponding operation of the ALE process may be performed without changing the temperature in each of the two process chambers, that is, the first process chamber 100a-1 and the second process chamber 100a-2. For example, the fluorination process may be performed in the first process chamber 100a-1, and then, the ligand exchange process may be performed in the second process chamber 100a-2. Accordingly, in the batch-type apparatus 1000b for ALE according to an embodiment, even when the processes of the first operation and the second operation of the ALE process have different process temperatures, the processing speed of the ALE process on the plurality of the wafer 500 may be optimized and maximized.

Figure 10A:
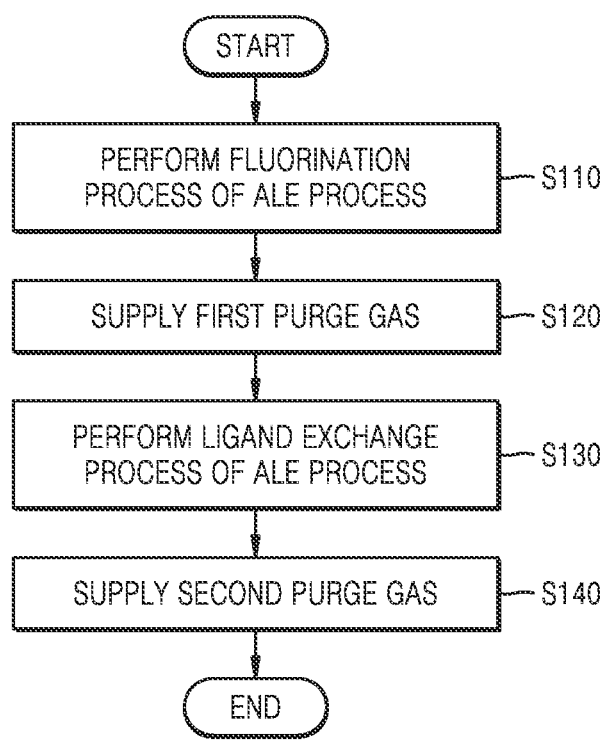
FIG. 10A is a flow chart schematically showing an ALE method based on a batch-type apparatus for ALE, according to embodiments of the present disclosure.
Figure 10B:
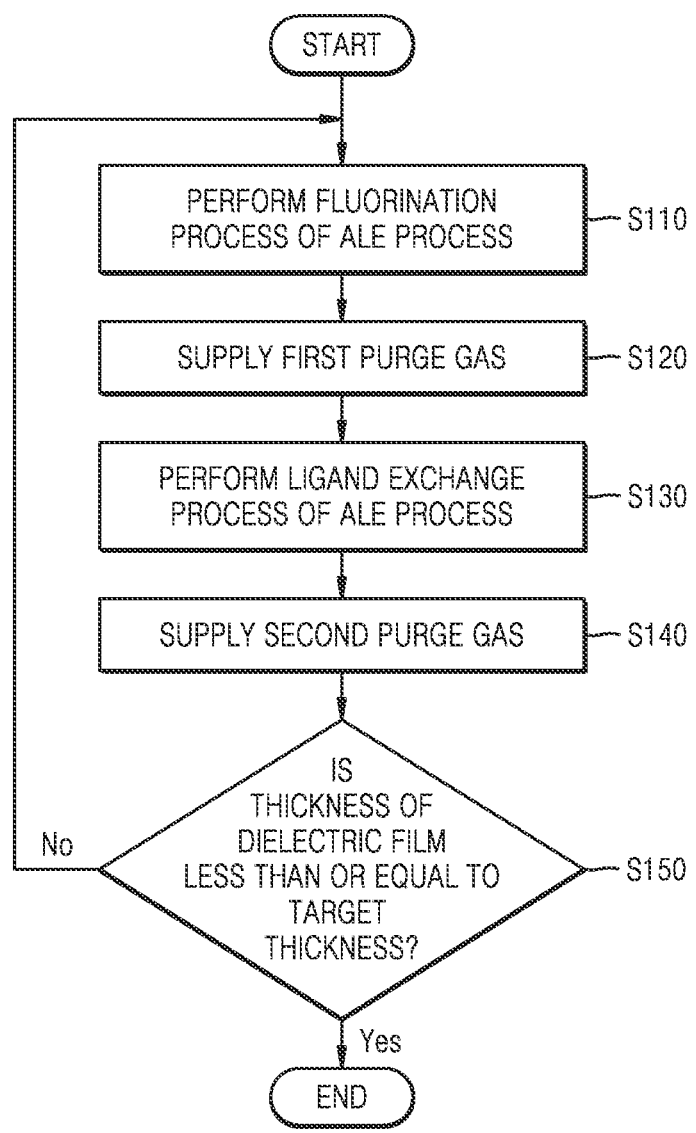
FIG. 10B is a flow chart schematically showing an ALE method based on a batch-type apparatus for ALE, according to embodiments of the present disclosure.

FIGS. 10A and 10B are flowcharts schematically showing an ALE method based on a batch-type apparatus for ALE, according to embodiments of the present disclosure. A description will be made with reference to FIGS. 1 through 3B together.

Referring to FIG. 10A, in an ALE method based on a batch-type apparatus for ALE according to an embodiment (hereinafter simply referred to as an 'ALE method'), first, a fluorination process of the ALE process is performed in operation S110. The fluorination process may refer to a process of converting an upper portion of a dielectric film into a metal-fluoride thin film by supplying a fluorine gas to a metal-based dielectric film, as described with reference to FIG. 3A above. As a detailed example, by supplying an HF gas to an $Al_2O_3$ thin film, a part of an upper portion of the $Al_2O_3$ thin film may be converted into an $AlF_3$ thin film. The fluorine gas may include $SF_4$, $XeF_4$, etc., without being limited to the HF gas.

On the other hand, the metal-based dielectric film such as the $Al_2O_3$ thin film may be crystallized through heat treatment before the fluorination process. In addition, in the ALE method according to the current embodiment, the metal-based dielectric film may be formed thicker than 50 Å, such that the heat treatment temperature may be relatively low. For example, the metal-based dielectric film may be crystallized at 400° C. or less. However, the crystallization temperature is not limited to the foregoing numerical values.

After the fluorination process, a first purge gas may be supplied in operation S120. The inside of the process chamber 100, for example, the inner tube 112, may be purged through the first purge gas to remove a residual gas, a by-product, etc. The first purge gas may include an inert gas, e.g., $N_2$, Ar, or the like.

A ligand exchange process of the ALE process may be performed in operation S130. The ligand exchange process may refer to a process of removing a thin film of a part of an upper portion of the dielectric film through a ligand exchange process by supplying a gas such as TMA, as described with reference to FIG. 3B above. A gas for the ligand exchange process may include $Sn(acac)_2$, $Al(CH_3)_2Cl$, $SiCl_4$, $TiCl_4$, $BCl_3$, $WF_6$, etc., without being limited to TMA.

After the ligand exchange process, a second purge gas may be supplied in operation S140. The inside of the process chamber 100, for example, the inner tube 112, may be purged through the second purge gas to remove a residual gas, a by-product, etc. The second purge gas may include an inert gas, e.g., $N_2$, Ar, or the like.

By discharging the second purge gas as an exhaust gas, the ALE process may be completed, and the part of the upper portion of the dielectric film on a semiconductor substrate may be removed. In addition, the ALE method according to an embodiment may simultaneously perform the ALE process on several wafers by using the batch-type apparatus 1000, the batch-type apparatus 1000a, or the batch-type apparatus 1000b for ALE of FIGS. 1, 9A, and 9B. In addition, when the batch-type apparatus 1000b for ALE of FIG. 9B is used, the process temperatures of the fluorination process and the ligand exchange process may be different from each other. The ALE process may be performed by performing the fluorination process in the first process chamber 100-1 and performing the ligand exchange process in the second process chamber 100-2.

Referring to FIG. 10B, the ALE method according to an embodiment may be different from the ALE method of FIG. 10A in that the ALE method further includes operation S150 of determining whether the thickness of the dielectric film is equal to or less than a target thickness in operation S150. More specifically, the ALE method according to an embodiment may include operation S150 of determining whether the thickness of the dielectric film is less than or equal to the target thickness, after operation S40 of supplying the second purge gas. Here, the target thickness may be, for example, 50 Å. However, the target thickness is not limited to the foregoing numerical value.

When the dielectric film is less than or equal to the target thickness (Yes), the ALE method may be terminated. However, when the thickness of the dielectric film exceeds the target thickness (No), the ALE method may proceed to operation S110 of performing the fluorination process. Operation S110 of performing the fluorination process through operation S40 of supplying the second purge gas may constitute one cycle of the ALE process, and the cycle of the ALE process may be repeated until the thickness of the dielectric film reaches the target thickness.

Figure 11:
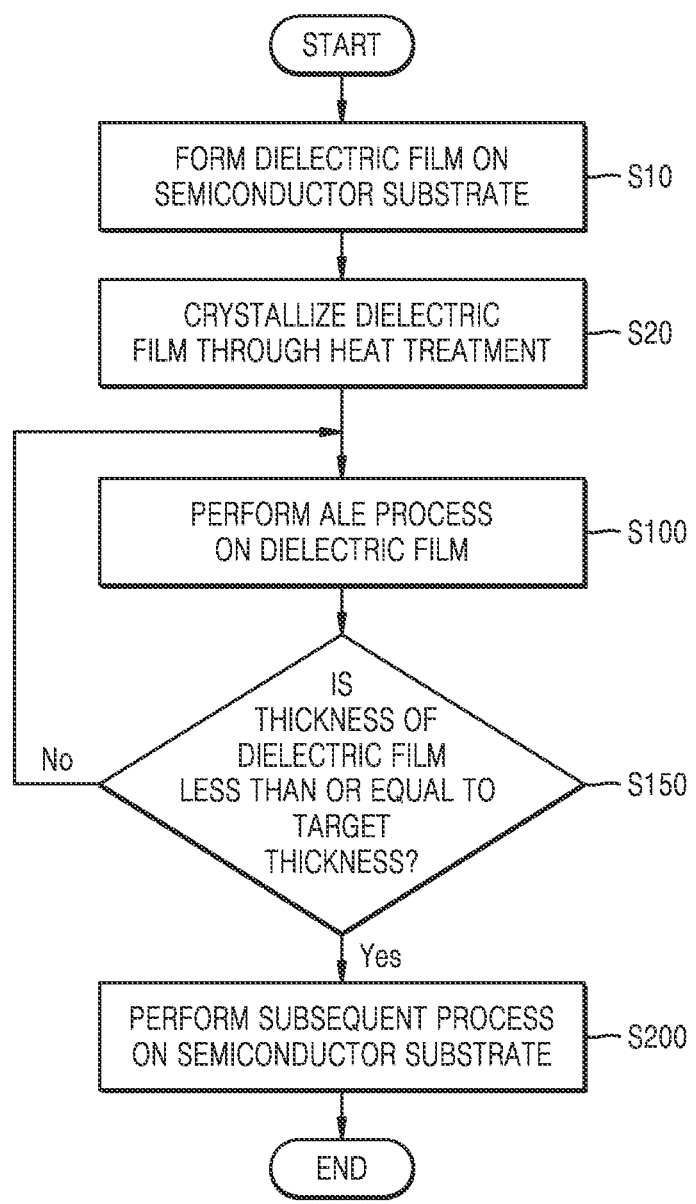
FIG. 11 is a flowchart schematically showing a semiconductor device manufacturing method based on a batch-type apparatus for ALE, according to embodiments of the present disclosure.

FIG. 11 is a flowchart schematically showing a semiconductor device manufacturing method based on a batch-type apparatus for ALE, according to embodiments of the present disclosure. A description will be made with reference to FIGS. 1 through 3B together and a description already made with reference to FIGS. 10A and 10B will be simplified or omitted.

Referring to FIG. 11, in a semiconductor device manufacturing method based on a batch-type apparatus for ALE according to an embodiment (hereinafter, simply referred to as a 'semiconductor device manufacturing method'), first, a dielectric film may be formed on a semiconductor substrate in operation S10. The dielectric film may be, for example, a metal-based dielectric film such as a metal oxide thin film or a metal nitride thin film, or a high dielectric film. The dielectric film may be formed to have a relatively thick thickness exceeding, for example, 50 Å, considering a heat treatment temperature. In addition, the dielectric film may be formed in an amorphous state.

After the dielectric film is formed, the dielectric film may be crystallized by being heat-treated in operation 520. For example, the dielectric film may be crystallized by being heat-treated at a temperature of 400° C. or less.

Thereafter, the ALE process may be performed on the dielectric film in operation S100. The ALE process may be substantially the same as the ALE method described as in the description of FIG. 10A. For example, the ALE process may include operation S110 of performing the fluorination process through operation S140 of supplying the second purge gas.

Next, in operation S150, it may be determined whether the thickness of the dielectric film is less than or equal to the target thickness. Here, the target thickness may be, for example, 50 Å. However, the target thickness is not limited to the foregoing numerical value.

When the thickness of the dielectric film exceeds the target thickness (No), the semiconductor device manufacturing method may proceed to operation S100 of performing the ALE process. Operation S100 of performing the ALE process may be continuously repeated until the thickness of the dielectric film reaches the target thickness.

When the thickness of the dielectric film is less than or equal to the target thickness (Yes), a subsequent process may be performed on the semiconductor substrate in operation S200. The subsequent process may include various processes. For example, the subsequent process may include a deposition process, an etching process, an ion process, a cleaning process, etc. Herein, the deposition process may refer to a process of forming various material layers on a semiconductor substrate through chemical vapor deposition (CVD), sputtering, spin coating, etc. The etching process and the cleaning process may refer to a process of removing the entire material layer or a part thereof through etching to form a pattern. The ion process may include processes such as ion implantation, diffusion, heat treatment, etc. Through this subsequent process, integrated circuits and wirings may be formed on a semiconductor substrate to manufacture a required semiconductor device.

In addition, the subsequent process may include a process of individualizing a wafer into each semiconductor chip, and a packaging process of mounting the semiconductor chip on a PCB and sealing the same with a sealing material. In addition, the subsequent process may include a test process of testing the semiconductor device or package. By performing such subsequent processes, the semiconductor device or the semiconductor package may be completed.

While non-limiting example embodiments of the present disclosure have been particularly shown and described, it will be understood that various changes in form and details may be made without departing from the spirit and scope of the disclosure.

What is claimed is:

1. A batch-type apparatus for atomic layer etching (ALE), the batch-type apparatus comprising a wafer stacking container that is configured to have therein a plurality of wafers that are arranged in a vertical direction, and the batch-type apparatus further comprising at least one process chamber, each of the at least one process chamber comprising:

an inner tube that extends in the vertical direction, and configured to include the wafer stacking container therein;

a plurality of nozzles arranged in a first outer portion in the inner tube, the plurality of nozzles extending in the vertical direction and configured to supply a gas to the plurality of wafers; and a heater that surrounds the inner tube and is configured to adjust a temperature in the inner tube, wherein each of the plurality of nozzles includes a plurality of gas injection holes, the plurality of gas injection holes provided at heights corresponding to heights of the plurality of wafers, respectively, wherein the inner tube includes a gas outlet in a second outer portion in the inner tube, opposite to the first outer portion in a first horizontal direction, wherein at least one nozzle among the plurality of nozzles comprises an inverted U shape in an upper portion of the at least one nozzle, and the plurality of gas injection holes of the least one nozzle are disposed along the inverted U shape and along a portion of the at least one nozzle that extends from an end of the at least one nozzle to the upper portion of the at least one nozzle, and wherein the end of the at least one nozzle is configured to receive the gas and supply the gas to the upper portion of the at least one nozzle.

2. The batch-type apparatus of claim 1, further comprising an outer tube surrounding the inner tube, wherein the plurality of nozzles are configured to be arranged adjacent to the wafer stacking container while the wafer stacking container is included in the inner tube.

3. The batch-type apparatus of claim 1, wherein the wafer stacking container comprises:

a bottom plate, support pillars extending from an outer portion of the bottom plate in the vertical direction, and apart from one another in a direction perpendicular to the vertical direction, and a top plate connected to an upper portion of each of the support pillars, and wherein side surfaces of the support pillars include slots that are configured to receive the plurality of wafers such that the plurality of wafers are arranged in the vertical direction.

4. The batch-type apparatus of claim 3, wherein the plurality of nozzles are configured to receive the gas at a bottom portion of the plurality of nozzles, and introduce the gas into the inner tube, and the gas outlet of the inner tube is configured to discharge the gas to an outside of the inner tube.

5. The batch-type apparatus of claim 1, wherein the gas outlet includes a slit in a form of a line extending in the vertical direction, or a plurality of holes or a plurality of open lines arranged in the vertical direction.

6. The batch-type apparatus of claim 1, wherein, in each of the plurality of nozzles, a size of the plurality of gas injection holes increases in an upward direction.

7. The batch-type apparatus of claim 1, wherein the plurality of nozzles comprise:

a first source gas nozzle configured to supply a first source gas for a fluorination process;

a second source gas nozzle configured to supply a second source gas for a ligand exchange process;

an atmosphere gas nozzle configured to supply an atmosphere gas; and a purge gas nozzle configured to supply a purge gas, and wherein the batch-type apparatus further comprises:

a first gas supply connected to the first source gas nozzle and comprising the first source gas, the first source gas comprising HF, $SF_4$, or $XeF_4$;

a second gas supply connected to the second source gas nozzle and comprising the second source gas, the second source gas comprising $Sn(acac)_2$, $Al(CH_3)_3$, $Al(CH_3)_2Cl$, $SiCl_4$, $TiCl_4$, $BCl_3$, or $WF_6$;

an atmosphere gas supply connected to the atmosphere gas nozzle and comprising the atmosphere gas, the atmosphere gas comprising $O_2$, $O_3$, $N_2$, or Ar; and a purge gas supply connected to the purge gas nozzle and comprising the purge gas, the purge gas comprising an inert gas.

8. The batch-type apparatus of claim 1, wherein the at least one process chamber is a plurality of process chambers that comprises a first process chamber and a second process chamber, the first process chamber is configured to perform a fluorination process of an ALE process, and the second process chamber is configured to perform a ligand exchange process of the ALE process.

9. The batch-type apparatus of claim 1, wherein the plurality of nozzles are arranged in a second horizontal direction crossing the first horizontal direction, and the at least one nozzle having the inverted U shape i-s-further comprises at least two nozzles having the inverted U shape, the at least two nozzles comprising:

an outermost first nozzle that is farthest among the plurality of nozzles towards an end of the second horizontal direction, wherein an upper portion of the outermost first nozzle comprises the inverted U shape, the inverted U shape of the outermost first nozzle being curved towards the end of the second horizontal direction; and an outermost second nozzle that is farthest among the plurality of nozzles towards an opposite end of the second horizontal direction, wherein an upper portion of the outermost second nozzle comprises the inverted U shape, the inverted U shape of the outermost second nozzle being curved towards the opposite end of the second horizontal direction.

10. The batch-type apparatus of claim 9, wherein a third nozzle, among the plurality of nozzles, between the outermost first nozzle and the outermost second nozzle does not include the inverted U shape.

11. A batch-type apparatus for atomic layer etching (ALE), the batch-type apparatus comprising:

a first process chamber of a batch type;

a second process chamber of a batch type, arranged adjacent to the first process chamber;

a gas supply configured to supply a gas to the first process chamber and the second process chamber; and a gas exhaust configured to discharge the gas from the first process chamber and the second process chamber, wherein each of the first process chamber and the second process chamber comprises:

a wafer stacking container that is configured to have therein a plurality of wafers that are arranged in a vertical direction, a process tube that extends in the vertical direction, the wafer stacking container inside the process tube, a plurality of nozzles arranged in a first outer portion in the process tube, the plurality of nozzles extending in the vertical direction and configured to supply the gas to the plurality of wafers, and a heater that surrounds the process tube and is configured to adjust a temperature of the process tube, wherein each of the plurality of nozzles includes a plurality of gas injection holes, the plurality of gas injection holes provided at heights corresponding to heights of the plurality of wafers, respectively, wherein the process tube includes a gas outlet in a second outer portion in the process tube, opposite to the first outer portion in a first horizontal direction, wherein at least one nozzle among the plurality of nozzles comprises an inverted U shape in an upper portion of the at least one nozzle, and the plurality of gas injection holes of the least one nozzle are disposed along the inverted U shape and along a portion of the at least one nozzle that extends from an end of the at least one nozzle to the upper portion of the at least one nozzle, and wherein the end of the at least one nozzle is configured to receive the gas and supply the gas to the upper portion of the at least one nozzle.

12. The batch-type apparatus of claim 11, wherein the process tube of the first process chamber comprises an inner tube, in which the wafer stacking container is provided, and an outer tube surrounding the inner tube, and the plurality of nozzles are arranged adjacent to the wafer stacking container in the inner tube, and the gas outlet is formed in the inner tube.

13. The batch-type apparatus of claim 11, wherein the wafer stacking container comprises:

a bottom plate, support pillars extending from an outer portion of the bottom plate in the vertical direction and apart from one another in a direction perpendicular to the vertical direction, and a top plate connected to an upper portion of each of the support pillars, and wherein side surfaces of the support pillars include slots that are configured to receive the plurality of wafers such that the plurality of wafers are arranged in the vertical direction.

14. The batch-type apparatus of claim 11, wherein, in each of the plurality of nozzles, a size of the plurality of gas injection holes increases in an upward direction.

15. The batch-type apparatus of claim 11, wherein each of the first process chamber and the second process chamber is configured to perform a fluorination process and a ligand exchange process of an ALE process, the plurality of nozzles of each of the first process chamber and the second process chamber comprises:

a first source gas nozzle configured to supply a first source gas for the fluorination process, and a second source gas nozzle configured to supply a second source gas for the ligand exchange process, and the gas supply comprises:

at least one first gas supply comprising the first source gas and connected to the first source gas nozzle of the first process chamber and the first source gas nozzle of the second process chamber, the first source gas comprising HF, $SF_4$, or $XeF_4$; and at least one second gas supply comprising the second source gas and connected to the second source gas nozzle of the first process chamber and the second source gas nozzle of the second process chamber, the second source gas comprising $Sn(acac)_2$, $Al(CH_3)_3$, $Al(CH_3)_2Cl$, $SiCl_4$, $TiCl_4$, $BCl_3$, or $WF_6$.

16. The batch-type apparatus of claim 11, wherein the first process chamber is configured to perform a fluorination process of an ALE process, the second process chamber is configured to perform a ligand exchange process of the ALE process, the plurality of nozzles of the first process chamber comprises a first source gas nozzle configured to supply a first source gas for the fluorination process, the plurality of nozzles of the second process chamber comprises a second source gas nozzle configured to supply a second source gas for the ligand exchange process, and the gas supply comprises:

a first gas supply comprising the first source gas and connected to the first source gas nozzle of the first process chamber, the first source gas comprising HF, $SF_4$, or $XeF_4$; and a second gas supply comprising the second source gas and connected to the second source gas nozzle of the second process chamber, the second source gas comprising $Sn(acac)_2$, $Al(CH_3)_3$, $Al(CH_3)_2Cl$, $SiCl_4$, $TiCl_4$, $BCl_3$, or $WF_6$.

17. The batch-type apparatus of claim 11, wherein the gas supply comprises a remote plasma (RP) device.

18. The batch-type apparatus of claim 11, wherein the plurality of nozzles are arranged in a second horizontal direction crossing the first horizontal direction, and the at least one nozzle having the inverted U shape i-s-further comprises at least two nozzles having the inverted U shape, the at least two nozzles comprising:

an outermost first nozzle that is farthest among the plurality of nozzles towards an end of the second horizontal direction, wherein an upper portion of the outermost first nozzle comprises the inverted U shape, the inverted U shape of the outermost first nozzle being curved towards the end of the second horizontal direction; and an outermost second nozzle that is farthest among the plurality of nozzles towards an opposite end of the second horizontal direction, wherein an upper portion of the outermost second nozzle comprises the inverted U shape, the inverted U shape of the outermost second nozzle being curved towards the opposite end of the second horizontal direction.

19. The batch-type apparatus of claim 18, wherein a third nozzle, among the plurality of nozzles, that is between the outermost first nozzle and the outermost second nozzle does not include the inverted U shape.

* * * * *